United States Patent [19]

Snyder et al.

[11] Patent Number: 4,759,124

[45] Date of Patent: Jul. 26, 1988

[54] METHOD AND APPARATUS FOR CONTROLLING COMPONENT PICKUP AND PLACEMENT PRESSURES

[75] Inventors: Michael D. Snyder, Binghamton; Bruce W. LeRoy, Endicott, both of N.Y.; Douglas A. Biesecker, Clark Summit; Henry J. Soth, Brackney, both of Pa.; James E. York, Endicott, N.Y.

[73] Assignee: Universal Instruments Corp., Binghamton, N.Y.

[21] Appl. No.: 43,625

[22] Filed: Apr. 28, 1987

[51] Int. Cl.[4] .......................... H05K 3/30; B23P 19/00

[52] U.S. Cl. .......................................... 29/834; 29/740; 29/743; 29/840; 294/2; 294/64.1

[58] Field of Search ................. 29/740, 741, 743, 759, 29/832, 834, 840; 294/2, 64.1

[56] References Cited

U.S. PATENT DOCUMENTS 4,527,327 7/1985 Van Deuren ......................... 29/740

4,611,397 9/1986 Janisiewicz et al. ............. 29/740 X

*Primary Examiner*—Carl E. Hall

*Attorney, Agent, or Firm*—Franklin D. Wolffe; Morris Fidelman

[57] ABSTRACT

Pressures applied to a component for pickup and placement thereof are each selectable, according to introduction of gas under pressure into a piston and cylinder configuration defined by a tool, such as a vacuum spindle, telescopically supported in a tool holder. An actuator with closed loop velocity and displacement control moves the tool holder to and fro along a longitudinal axis according to a known programmable controller. Thus, compression of the gas and relative displacement between the tool and holder allows controlled pick and place pressures to be varied and monitored programmably. The pressurized gas also acts to prevent dirt contamination of the bearing surface between the tool and holder and consequent impairment of telescoping and rotational movements therebetween.

10 Claims, 2 Drawing Sheets

196
194
166
168
202
198
192
167
190
200
80

74
76
210
208
206
78
46
44
212

METHOD AND APPARATUS FOR CONTROLLING COMPONENT PICKUP AND PLACEMENT PRESSURES

BACKGROUND OF THE INVENTION

The invention is directed to an improved method and apparatus of imparting accurate, reliable, and selective pressures on components during picking and placing thereof. In particular, the invention is directed to a method and apparatus of picking up a component from a supply surface and placing the component onto a substrate surface and applying pressures selectively to the component when it is sandwiched between a tool and either of the supply or substrate surfaces.

In this regard, the reader's attention is directed to U.S. Pat. No. 4,611,397—PICK AND PLACE METHOD AND APPARATUS FOR HANDLING ELECTRICAL COMPONENTS—Janisiewicz, et al, issued Sept. 16, 1986, and the disclosure thereof is incorporated herein by reference, since the instant invention is particularly applicable to the subject matter thereof.

The apparatus of the above-mentioned patent provides an inner spindle telescopic within an outer spindle, with the pressure experienced by a component during sandwiching thereof between a surface and the tip of the inner spindle being sensed according to telescoping of the spindles and compression of a spring between the inner spindle and a load cell. The apparatus of this earlier patent experienced contamination of internal bearing surfaces with dirt drawn in between the inner and outer spindles by the vacuum applied to the spindles. The vacuum also created an additional compressive force against the load cell which could not be counteracted. Also, erratic readings and poor placement pressure accuracies are directly attributable to sensitivity of the load cell to temperature and vibration. The compression spring typically had a spring constant with a plus or minus 20 percent margin of error so as to be very unreliable. Still further, this prior art device was not adapted to compensate for binding which can occur when the actuator drive and the longitudinal axis of the spindle assembly become slightly out of parallel from wear or tolerances, resulting in poor actuator movement.

Accordingly, it is the object of the instant invention to improve the reliability and accuracy and selectivity of pick and place pressures, particularly when dealing with a component commonly referred to as a surface mountable component (SMC).

It is another object of the invention to reduce placement force tolerances to within plus or minus 10 percent throughout a range of about 3.5 to about 50 pounds per square inch.

It is another object of the invention to obviate the earlier described pick and place pressure unreliabilities caused by compression spring tolerances.

It is also an object of the invention to obviate inaccurate pressure readings due to additional compressive forces being applied to a load cell or the like by the vacuum by which the component is held.

It is also an object of the invention to eliminate or obviate dirt contamination of bearing surfaces as caused by vacuum drawing in dirt between the inner and outer spindles.

It is a further object of the invention to obviate potential "binding" caused by a spindle axis and a drive axis being slightly unparallel.

Still further, an object of this invention is to improve the accuracies of orientation of a component about the Z-axis during rotation of the vacuum spindle thereabout.

BRIEF SUMMARY OF THE INVENTION

The outer spindle is moved to and fro along its longitudinal axis by a Z-axis servo with the vacuum spindle being telescopic into the outer spindle according to pressurization of a piston and cylinder relationship therebetween. A compressible gas (air) is provided between the inner and outer spindles and is regulateable in order to ensure that the component experiences a particular pressure when sandwiched between the tip of the inner spindle and an opposite surface. For instance, the pressure experienced by a component during pickup or placement may continue during Z-axis advance of the outer spindle, while compressing preregulated gas between the spindles until relative displacement between the inner and outer spindles actuates a switch. Preferably, a (lesser) bias pressure is applied between the inner and outer spindles prior to a relative telescoping displacement between the two spindles, to prevent back flow pressure due to velocity and displacement from exceeding programmed pressure, whereupon the (greater) positive fluid pressure may be applied therebetween, as selected and programmed, after the spindles are telescoped sufficiently for the optic switch to be actuated.

DETAILED DESCRIPTION OF THE INVENTION

Where applicable, component parts of the apparatus illustrated herein are numbered the same as in the figures of U.S. Pat. No. 4,611,397, in order that the reader may better understand operation of the instant invention and the improvements thereof over the prior art.

Figure 1:
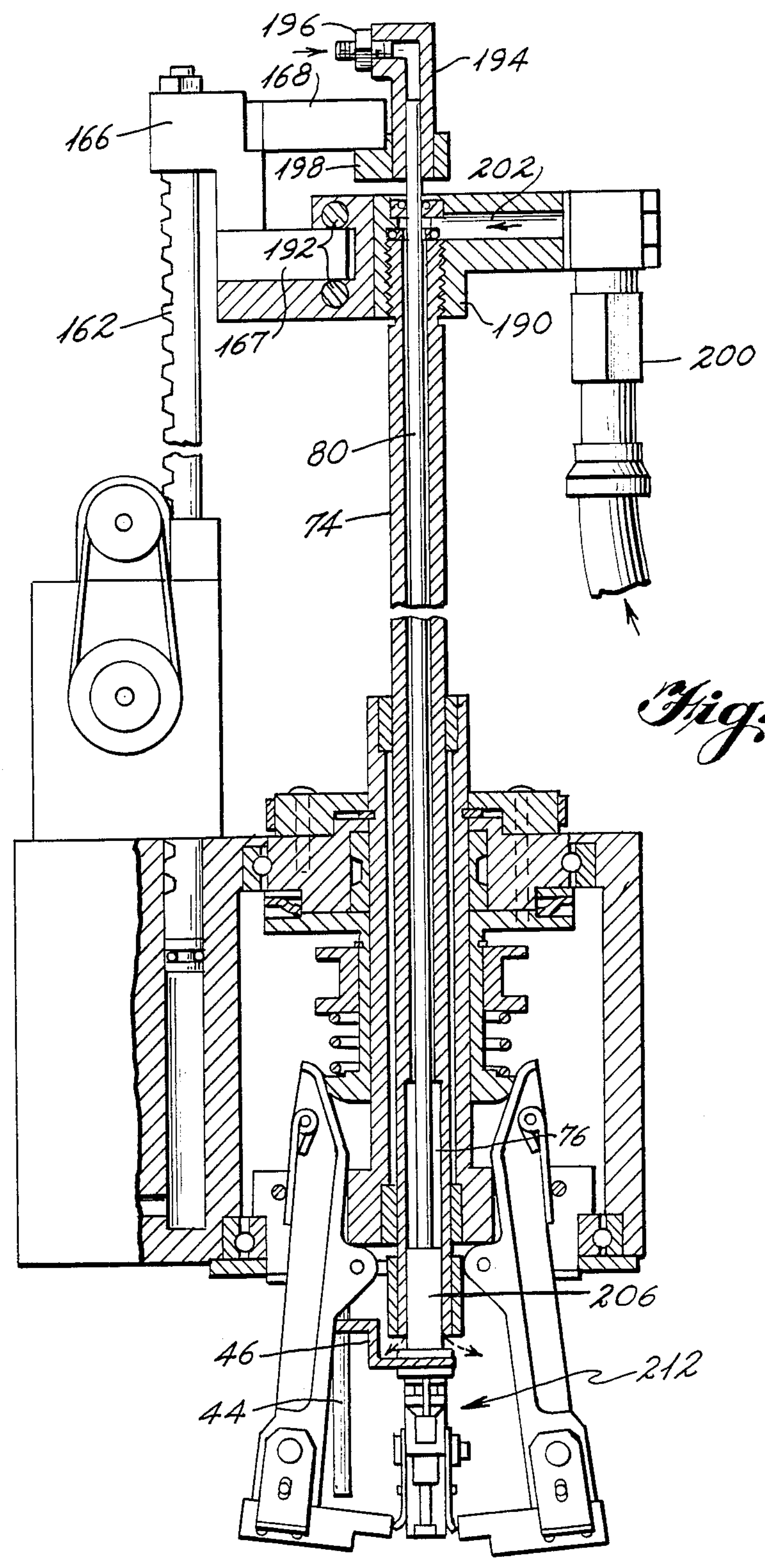
FIG. 1 is an elevational view, with portions thereof broken away and shown in cross section for purposes of explanation of the invention
Figure 2:
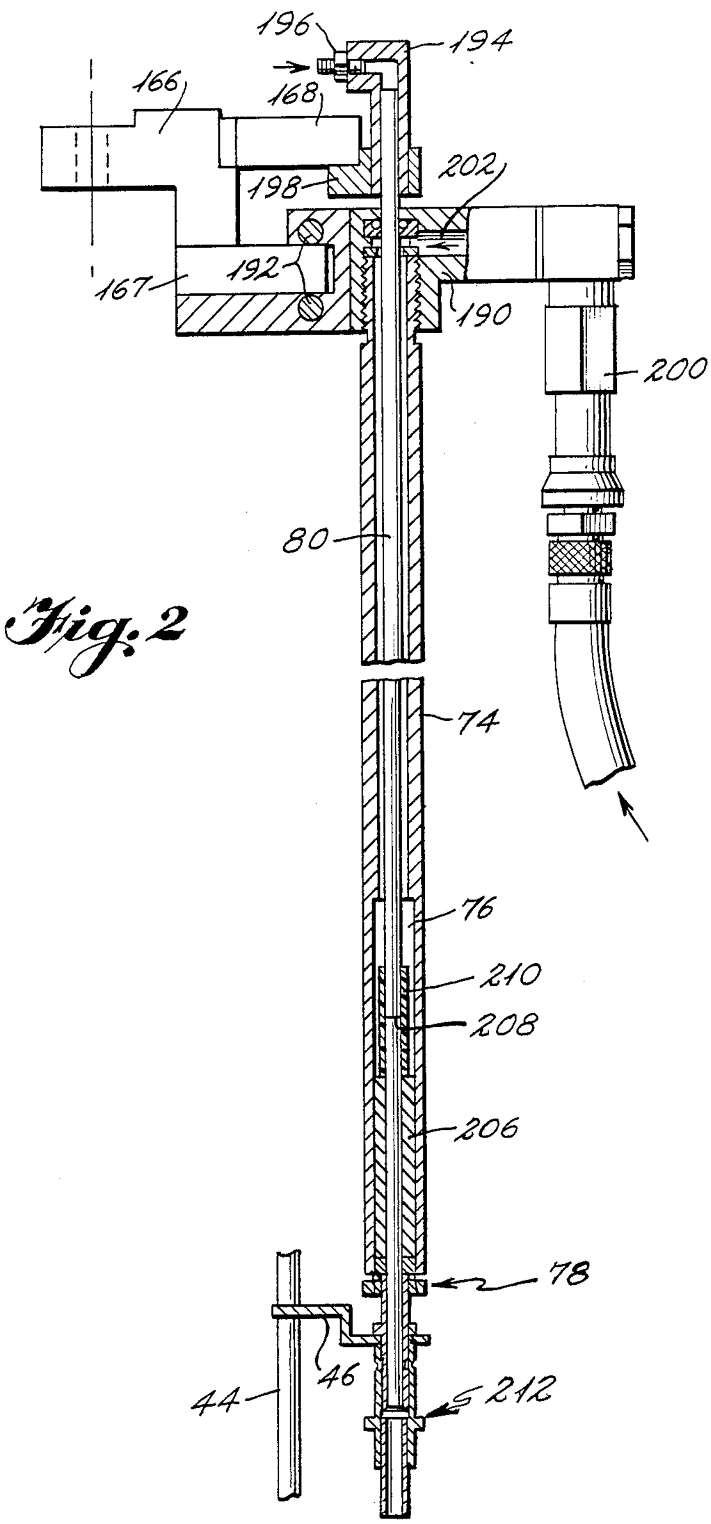
FIG. 2 is a partial, cross sectional view in order to illustrate the structural relationship between the inner and outer spindle in greater detail.

A particular distinction between the apparatus of the instant invention and that of the earlier patent is application of vacuum directly to inner spindle 80 and application of positive air pressure between inner spindle 80 and outer spindle 74 via air fitting 200 and duct 202. Thus, as viewed in FIG. 1, this positive air pressure tends to repel or prevent dirt or dust from intruding into the outer spindle via a typical space of 0.0002–0.0005 inches between the inner and outer spindles, and leakage of the pressurized fluid there between as indicated by the arrows in FIG. 1.

The earlier mentioned patent provided rotation to the inner spindle indirectly via a pin and slot connection between the inner and outer spindles, resulting in less precise control of rotation angles. According to the instant invention, the fork or yoke 46 has been directly attached to the inner spindle so as to provide rotation about the longitudinal Z-axis of the spindle according to a rotation servo (not shown).

A sliding relationship between block 167 and steel dowels 192 (horizontally and angularly in a plane generally perpendicular to the spindle axis) compensates for any unparallelness between the axis drive rack 162 and the longitudinal axis of the spindle assembly.

In order to detect relative displacement between the inner and outer spindles, inner spindle 80 has member 194 attached to the top thereof and supporting a flag 198. Flag 198 can make an optic switch 168 when inner spindle 80 is raised relative to outer spindle 74, in response to the reactive force from a component being picked or placed.

STEPS OF OPERATION

In preparation for picking up a component, an initial bias pressure is supplied to cylinder 76 via air pressure fitting 200. Additionally, the range or gap is established or set through which the tip of inner spindle 80 will be advanced toward the component at a controlled constant velocity after initially being accelerated and decelerated to reach the start of this gap. Because of the reduced, constant velocity, the gap size can greatly add to the overall component handling time and should be minimized in order to minimize the time necessary to pickup a component. Having established the bias pressure and constant velocity gap, the pick and place tooling is positioned in X and Y directions perpendicular to the longitudinal axis (Z-axis) of the spindle for pickup of a component.

Thereafter, outer spindle 74 is accelerated and decelerated by the Z-axis servo toward a component until the tip of inner spindle 80 reaches the start of the established constant velocity gap. Then, the actuator advances outer spindle 74, which carries inner spindle 80, at a constant velocity through this gap until impact of the tip of inner spindle 80 with the top surface of the component. Thus, inner spindle 80 is stopped by this impact, while the Z-axis servo continues to advance outer spindle 74 at the constant velocity so as to compress the air within cylinder 76 by piston-like enlargement 206 on inner spindle 80. In other words, impact of the inner spindle 80 with the component during pickup thereof halts the inner spindle 80, while the outer spindle 74 continues to advance toward the component against the positive bias pressure initially introduced between the inner and outer spindles. This advancing of outer spindle 74 relative to the halted inner spindle 80 continues at constant low velocity, with spindles 74 and 80 telescoping until the optical switch 168 on the outer spindle housing is made by flag 198 on the inner spindle. Switch 168 then signals the controller to decelerate the advancing actuator to zero velocity.

After the outer spindle 74 has decelerated to zero velocity, the positive pressure in chamber 76 between the inner and outer spindles is increased to the selected and preprogrammed value of, for instance, 3.5 PSI. An optimized time delay (e.g., 50 milliseconds) for applying vacuum to inner spindle 74, in order to hold the component to the tip thereof, is generally long enough to reach the programmed pressure.

Next, the actuator retracts outer spindle 74 away from the surface on which the component is resting at a velocity sufficiently upper-limited, until the inner spindle 80 is fully extended out of the outer spindle 74, so as to prevent loss of the component. During retraction, the point is reached when inner spindle 80 is fully extended out of outer spindle 74 so that the component is about to be picked off of the supply surface. The effect on the component of a jolt between inner spindle 80 and outer spindle 74, when inner spindle 80 reached its limit of extension from outer spindle 74, could knock the component off of the tip of inner spindle 80. Thus, such upper-limit control of the velocity is desirable.

With inner spindle 80 fully extended out of outer spindle 74, maximum available pressure (e.g., 50 PSI) is introduced between the spindles in order to stiffen them in this fully extended condition and thus prevent inertial effects, such as bouncing of the inner spindle within the outer spindle, when later accelerating and decelerating to a reference "home" position of retraction of outer spindle 74. The spindle is then moved to home position as fast as possible without loss of the component. Having reached the home position, the pressure between the inner and outer spindles is reset to a bias pressure with which the component will be subsequently placed onto a printed circuit board. Then the pick and place assembly is repositioned along the X- and Y-axes above a location on the circuit board at which the component is to be placed.

For placement of the component, a constant velocity gap again is selected according to the thickness of the component and the outer spindle 74 is accelerated and decelerated via the actuator until the upper limit of this gap is reached by the component, whereafter the outer spindle 74 is advanced at a controlled constant velocity for a distance equal to this gap. Impact of the component with the printed circuit board halts advancing of inner spindle 80, while outer spindle 74 continues to advance at a controlled constant velocity. Telescoping of outer spindle 74 down over inner spindle 80 after impact of the component with the printed circuit board causes optic switch 168 to be made by flag 198, whereupon the actuator is controlled to decelerate outer spindle 74 to a zero velocity relative to the velocity of inner spindle 80.

At this time, a selected, preprogrammed pressure (e.g., 3.5–50 PSI) is applied to chamber 76 between the inner and outer spindles during an optimized (e.g., 125 milliseconds) time delay. The time delay allows for turning off the vacuum to spindle 80 and applying an "air kiss" thereto. This slight positive air kiss pressure ensures release of the component from the tip of inner spindle 80. Thereafter, the actuator retracts the spindles at maximum velocity and the pick and place tooling is X-Y positioned above the next component to be picked from the supply.

In a prototype of the invention, a voltage controlled, variable air pressure valve, model number BB1F, manufactured by Proportion Air Inc. of McCordsville, Ind. was used for closed loop control of the applied positive air pressure. The actuator system provided closed loop control of velocity and position.

For overall automated control of the method and apparatus, a controller (not shown) may include a microprocessor or the like in a manner well known in the art involved. The controller used in a prototype was Model No. 8223, manufactured by Universal Instruments Corporation, Binghamton, N.Y.

When picking up components of sufficient size, it is sometimes preferable to provide a time delay, after retracting the outer spindle sufficiently for the inner spindle to telescope therefrom by the maximum amount allowed, thus allowing for settling of any spindle bounce and for stiffening of the fully telescoped spindles.

Having described the invention, it will be seen that the objects set forth above, among those made apparent from the preceding description, are efficiently obtained and, since certain changes may be made in carrying out the above method and in the construction set forth without departing from the scope of the invention, it is intended that all matter contained in the above description or shown in the accompanying drawings shall be interpreted as illustrative and not in a limiting sense.

For instance, although the invention has been described with particular reference to handling of SMC electrical components, it is considered within the context of the invention that other types of components or parts may be picked and/or placed within the conceptual bounds of the instant invention. Further, means for holding the component other than, or in addition to, the vacuum spindle are considered to fall within the inventive concept.

It is also to be understood that the following claims are intended to cover all of the generic and specific features of the invention described herein and all statements of the scope of the invention which, as a matter of language, might be said to fall therebetween.

We claim:

1. In a method of picking up a component by a tool from a supply surface and placing said component onto a substrate surface and applying pressure selectively to said component when sandwiched between said tool and each of said surfaces, the improvement comprising the step of:

providing a configuration of a piston and cylinder defined by a telescoping relation between said tool and a holder for said tool; and applying fluid between said piston and cylinder of said tool and holder of said tool at a particular positive pressure, selectable and proportional to preferred picking and placing pressures, respectively, to be experienced by said component according to compression of said fluid in said cylinder by said piston.

2. The improvement as in claim 1, and further comprising the steps of:

compressing said fluid during said applying of pressure to said component; and detecting said preferred pressures as a function of said compressing.

3. The method of claim 1, and further comprising the step of:

applying said fluid between said tool and holder at said particular pressure after sandwiching of said component between said tool and each of said surfaces and according to detection of a relative displacement between said tool and holder.

4. The improvement of claim 1, and further comprising the steps of:

applying said fluid between said tool and holder at said particular pressure prior to said sandwiching;

compressing said fluid and displacing said tool relative to said holder during said sandwiching; and monitoring said displacing as a function of said picking and placing pressures, respectively, and controlling advancing of said tool holder and corresponding increasing of pressure on said component in response to said monitoring.

5. In an apparatus for picking up a component by a tool from a supply surface and placing said component onto a substrate surface and applying pressure to said component when sandwiched between said tool and each of said surfaces, the improvement comprising:

a configuration of a piston and cylinder defined by a telescoping relation between said tool and a holder for said tool; and means for applying fluid under pressure between said piston and cylinder in order to apply preferred picking and placing pressures, respectively, to said component.

6. The improvement as in claim 5, and further comprising:

means for compressing said fluid by said tool during said applying of pressure to said component; and means for detecting said preferred pressures as a function of said compressing.

7. The improvement of claim 5, and further comprising:

means for detecting relative displacement between said tool and holder; and means for applying said fluid between said tool and holder at said particular pressure after said sandwiching of said component and according to said detecting.

8. The improvement as in claim 5, and comprising:

means for applying said fluid between said tool and holder at said particular pressure prior to said sandwiching;

means for compressing said fluid and displacing said tool relative to said holder during said sandwiching; and means for monitoring said displacing as a function of said picking and placing pressures, respectively, and controlling advancing of said tool holder and corresponding increasing of pressure on said component in response to said monitoring.

9. The improvement as in claim 5, and further comprising:

means for controlling said applying of fluid pressure selectively.

10. The improvement as in claim 5, and further comprising:

means for leaking said fluid under pressure from between said tool and holder in order to prevent ingress of dirt therebetween.

* * * * *